United States Patent
Fifield et al.

(10) Patent No.: US 7,068,105 B2
(45) Date of Patent: *Jun. 27, 2006

(54) LOW-VOLTAGE DIFFERENTIAL AMPLIFIER

(75) Inventors: John Atkinson Fifield, Underhill, VT (US); Steven Harley Lamphier, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/230,898

(22) Filed: Sep. 20, 2005

(65) Prior Publication Data

US 2006/0012430 A1    Jan. 19, 2006

Related U.S. Application Data

(62) Division of application No. 10/707,891, filed on Jan. 21, 2004, now Pat. No. 6,975,169.

(51) Int. Cl.
*H03F 3/45* (2006.01)

(52) U.S. Cl. .................................. 330/253; 330/257

(58) Field of Classification Search ............... 330/252, 330/253, 357, 254, 9, 255, 258, 264, 265, 330/269, 288
See application file for complete search history.

(56) References Cited

U.S. PATENT DOCUMENTS

| | | | | |
|---|---|---|---|---|
| 4,933,644 A * | 6/1990 | Fattaruso et al. | ............ | 330/258 |
| 5,621,357 A * | 4/1997 | Botti et al. | ................. | 330/253 |
| 5,621,358 A * | 4/1997 | Pisati et al. | ................. | 330/253 |
| 5,801,564 A * | 9/1998 | Gasparik | ..................... | 327/170 |
| 5,831,480 A * | 11/1998 | Kato et al. | .................... | 330/253 |
| 5,939,931 A * | 8/1999 | Noro | ........................... | 327/424 |
| 6,005,439 A * | 12/1999 | Fong | .......................... | 330/253 |
| 6,049,229 A * | 4/2000 | Manohar et al. | .............. | 326/83 |
| 6,208,208 B1 * | 3/2001 | Komatsu et al. | ............ | 330/255 |
| 6,252,435 B1 * | 6/2001 | Wu et al. | ...................... | 327/65 |
| 6,507,245 B1 * | 1/2003 | Tai | .............................. | 330/255 |
| 6,586,990 B1 * | 7/2003 | Udo et al. | ..................... | 330/9 |
| 6,614,302 B1 * | 9/2003 | Abe | ........................... | 330/253 |

* cited by examiner

*Primary Examiner*—Rexford Barnie
*Assistant Examiner*—Linh Van Nguyen
(74) *Attorney, Agent, or Firm*—Michael J. LeStrange; Dillon & Yudell LLP

(57) ABSTRACT

A low-voltage differential amplifier circuit is disclosed. The low-voltage differential amplifier circuit includes a first differential amplifier, a second differential amplifier and a summing circuit. The first differential amplifier receives a pair of differential input signals to generate a first output. The second differential amplifier receives the same pair of differential input signals to generate a second output. The summing circuit sums the first output of the first differential amplifier and the second output of the second differential amplifier to provide a common output.

15 Claims, 3 Drawing Sheets

LOW-VOLTAGE DIFFERENTIAL AMPLIFIER

CROSS-REFERENCE TO A RELATED APPLICATION

The present application is a divisional of U.S. patent application Ser. No. 10/707,891, filed on Jan. 21, 2004 is now a U.S. Pat. No. 6,975,169. Applicants claim benefit of priority under 35 U.S.C. § 120 to the above-mentioned patent application.

BACKGROUND OF INVENTION

1. Technical Field

The present invention relates to electronic circuits in general, and, in particular, to differential amplifier circuits. Still more particularly, the present invention relates to a low-voltage differential amplifier circuit having a wide common mode range.

2. Description of Related Art

A conventional differential amplifier circuit typically includes a pair of field effect transistors with the gates as differential inputs and the drains as outputs. The conventional differential amplifier circuit also includes a current source connected to the sources of the field effect transistors to supply a fixed current to the field effect transistors. During operation, the differential voltage inputs supplied to the gates are compared, and the conductivity of one of the field effect transistors is raised whilst the conductivity of the other transistor is lowered.

Conventional differential amplifier circuits are best operated in a common mode range (CMR) centered around $V_{dd}/2$. When outside the above-mentioned CMR, the outputs of conventional differential amplifier circuits may not be acceptable. Such limitation in the CMR tend to restrict the type of applications conventional differential amplifier circuits can be employed.

There are several solutions for increasing the CMR of a conventional differential amplifier circuit. However, none of the solutions allow proper operations from 0.1 to $(V_{dd}-0.2)$ volt over the entire process, voltage and temperature (PVT) operating range. Consequently, it would be desirable to provide an improved differential amplifier circuit having a relatively wide common mode range.

SUMMARY OF INVENTION

In accordance with a preferred embodiment of the present invention, a differential amplifier circuit includes a first differential amplifier, a second differential amplifier and a summing circuit. The first differential amplifier receives a pair of differential input signals to generate a first output. The second differential amplifier receives the same pair of differential input signals to generate a second output. The summing circuit sums the first output of the first differential amplifier and the second output of the second differential amplifier to provide a common output for the differential amplifier circuit.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
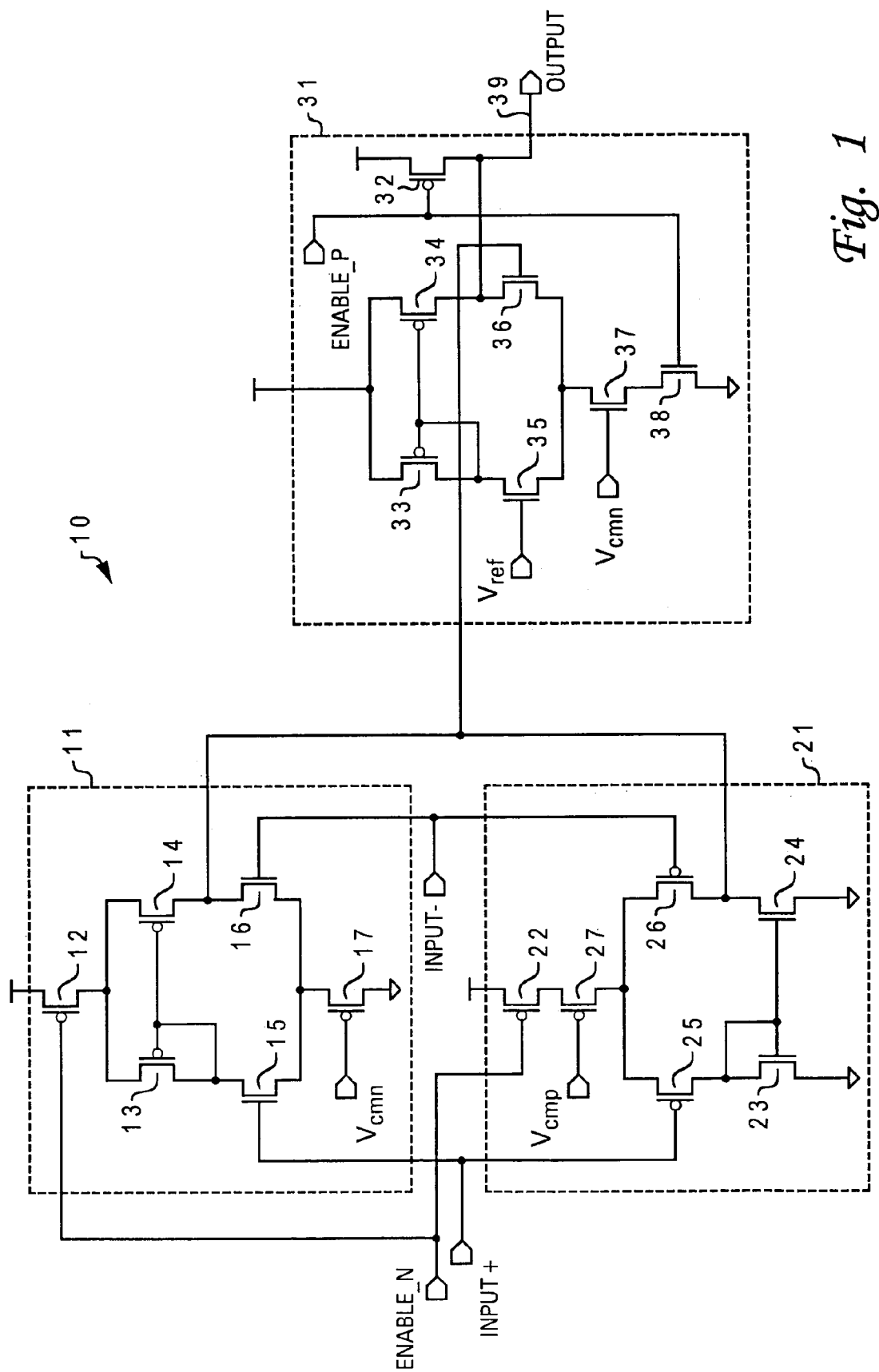
FIG. 1 is a circuit diagram of a differential amplifier circuit, in accordance with a preferred embodiment of the present invention.

Referring now to the drawings and in particular to FIG. 1, there is depicted a circuit diagram of a differential amplifier circuit, in accordance with a preferred embodiment of the present invention. As shown, a differential amplifier circuit 10 includes a first differential amplifier 11, a second differential amplifier 21 and a summing circuit 31. First differential amplifier 11 and second differential amplifier 21 are connected in parallel with each other and both share the respective differential inputs. The outputs of first differential amplifier 11 and second differential amplifier 21 are combined by summing circuit 31 to produce a single common output for differential amplifier circuit 10.

First differential amplifier 11 includes p-channel transistors 12–14 and n-channel transistors 15–17. P-channel transistor 13 is connected in series with n-channel transistor 15. Similarly, p-channel transistor 14 is connected in series with n-channel transistor 16. The gate and drain of p-channel transistor 13 are connected to the gate of p-channel transistor 14. P-channel transistor 12 is connected between Vdd and the drains of p-channel transistors 13–14. N-channel transistor 17 is connected between the sources of n-channel transistors 15–16 and ground. The gate of n-channel transistor 17 is connected to $V_{CMN}$—a gate control voltage to control the current through n-channel transistor 17 in a consistent and predictable manner using a current mirror technique. The gate of p-channel transistor 12 is connected to an active low ENABLE_N signal. Because n-channel differential amplifiers 15–16 receive differential input pair-input+ and input−, first differential amplifier 11 is considered as an n-channel differential amplifier.

Second differential amplifier 21 includes p-channel transistors 22, 25–27 and n-channel transistors 23–24. P-channel transistor 25 is connected in series with n-channel transistor 23. Similarly, p-channel transistor 26 is connected in series with n-channel transistor 24. The gate and drain of n-channel transistor 23 are connected to the gate of n-channel transistor 24. P-channel transistors 22 and 27 are connected in series between $V_{dd}$ and the sources of p-channel transistors 25–26. The gate of n-channel transistor 27 is connected to $V_{CMP}$—a gate control voltage to control the current through p-channel transistor 27 in a consistent and predictable manner using a current mirror technique. The sources of n-channel transistors 23–24 are connected to ground. The gate of p-channel transistor 22 is connected to ENABLE_N signal. Because p-channel differential amplifiers 25–26 receive differential input pair-input+ and input−, second differential amplifier 21 is considered as a p-channel differential amplifier.

Summing circuit 31 includes p-channel transistors 32–34 and n-channel transistors 35–38. P-channel transistor 33 is connected in series with n-channel transistor 35. Similarly, p-channel transistor 34 is connected in series with n-channel transistor 36. The gate and drain of p-channel transistor 33 are connected to the gate of p-channel transistor 34. N-channel transistors 37–38 are connected in series between the sources of n-channel transistors 35–36 and ground. The gate of n-channel transistor 37 is connected $V_{CMN}$. The gate of n-channel transistor 35 is connected to a reference voltage $V_{ref}$. Reference voltage $V_{ref}$ provides proper voltage biasing for summing circuit 31. Reference voltage $V_{ref}$ is preferably generated by a reference voltage generation circuit shown in FIG. 2. The gate of n-channel transistor 36 is connected to the output of first differential amplifier 11 (i.e., the node between p-channel transistor 14 and n-channel transistor 16) and to the output of second differential amplifier 21 (i.e., the node between p-channel transistor 26 and n-channel transistor 24). The drain of p-channel transistor 32 is connected to the node between p-channel transistor 34 and n-channel transistor 36 to provide a single common output 39 for differential amplifier circuit 10. The gates of p-channel transistor 32 and n-channel transistor 38 are connected to an active low ENABLE_P signal. P-channel transistor 32 is a clamp device to hold output 39 high when ENABLE_P is low (i.e., inactive).

During operation, an active low ENABLE_N signal is applied to the gates of p-channel transistors 12 and 22, and an active high ENABLE_P signal is applied to p-channel transistor 32 and n-channel transistor 38. A pair of differential input signals are applied to the gates of n-channel transistor 15 and p-channel transistor 25 via input+, and to the gates of n-channel transistor 16 and p-channel transistor 26 via inputB, respectively. The output for first differential amplifier 11 is generated at the node located between p-channel transistor 14 and n-channel transistor 16. Concurrently, the output for second differential amplifier 21 is generated at the node located between p-channel transistor 26 and n-channel transistor 24. The outputs from first differential amplifier 11 and second differential amplifier 21, which are analog in nature, are subsequently combined by summing circuit 31 at the gate of n-channel transistor 36. In turn, summing circuit 31 provides a common output signal at output 39 for differential amplifier circuit 10.

Figure 2:
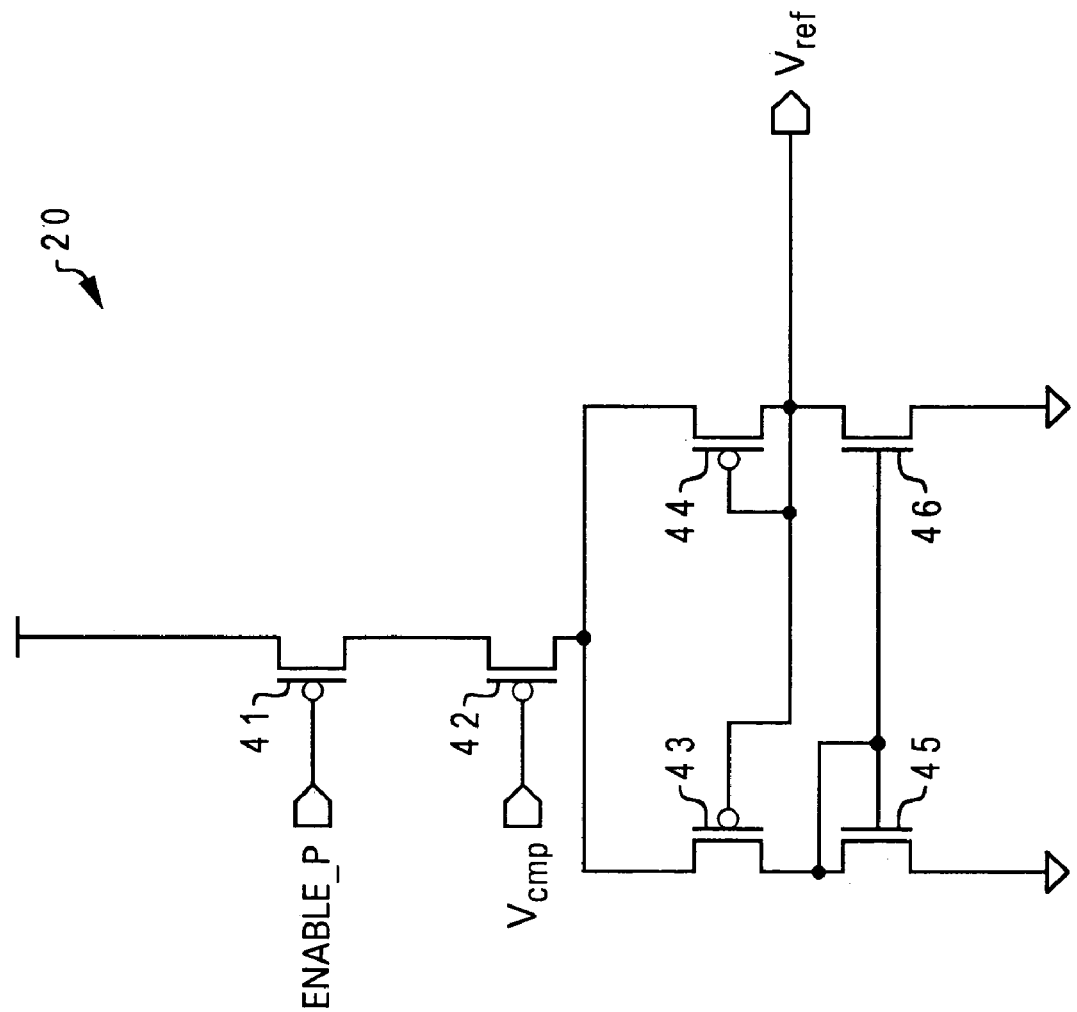
FIG. 2 is a circuit diagram of a reference voltage generation circuit to be used with a summing circuit within the differential amplifier circuit from FIG. 1, in accordance with a preferred embodiment of the present invention.

With reference now to FIG. 2, there is depicted a circuit diagram of a reference voltage generation circuit for summing circuit 31, in accordance with a preferred embodiment of the present invention. As shown, a reference voltage generation circuit 20 includes p-channel transistors 41–44 and n-channel transistors 45–46. P-channel transistors 41–42 are connected in series between $V_{dd}$ and the sources of p-channel transistors 43–44. The gate of p-channel transistor 41 is connected to active low ENABLE_P signal. The gate of p-channel transistor 42 is connected to $V_{CMP}$. P-channel transistor 43 is connected in series with n-channel transistor 45. Similarly, p-channel transistor 44 is connected in series with n-channel transistor 46. The gate and drain of n-channel transistor 45 are connected to the gate of n-channel transistor 46. The sources of n-channel transistors 45–46 are connected to ground. The gate and drain of p-channel transistor 44 are connected to the gate of p-channel transistor 43 to generate a reference voltage $V_{ref}$ for summing circuit 31 (from FIG. 1).

Figure 3:
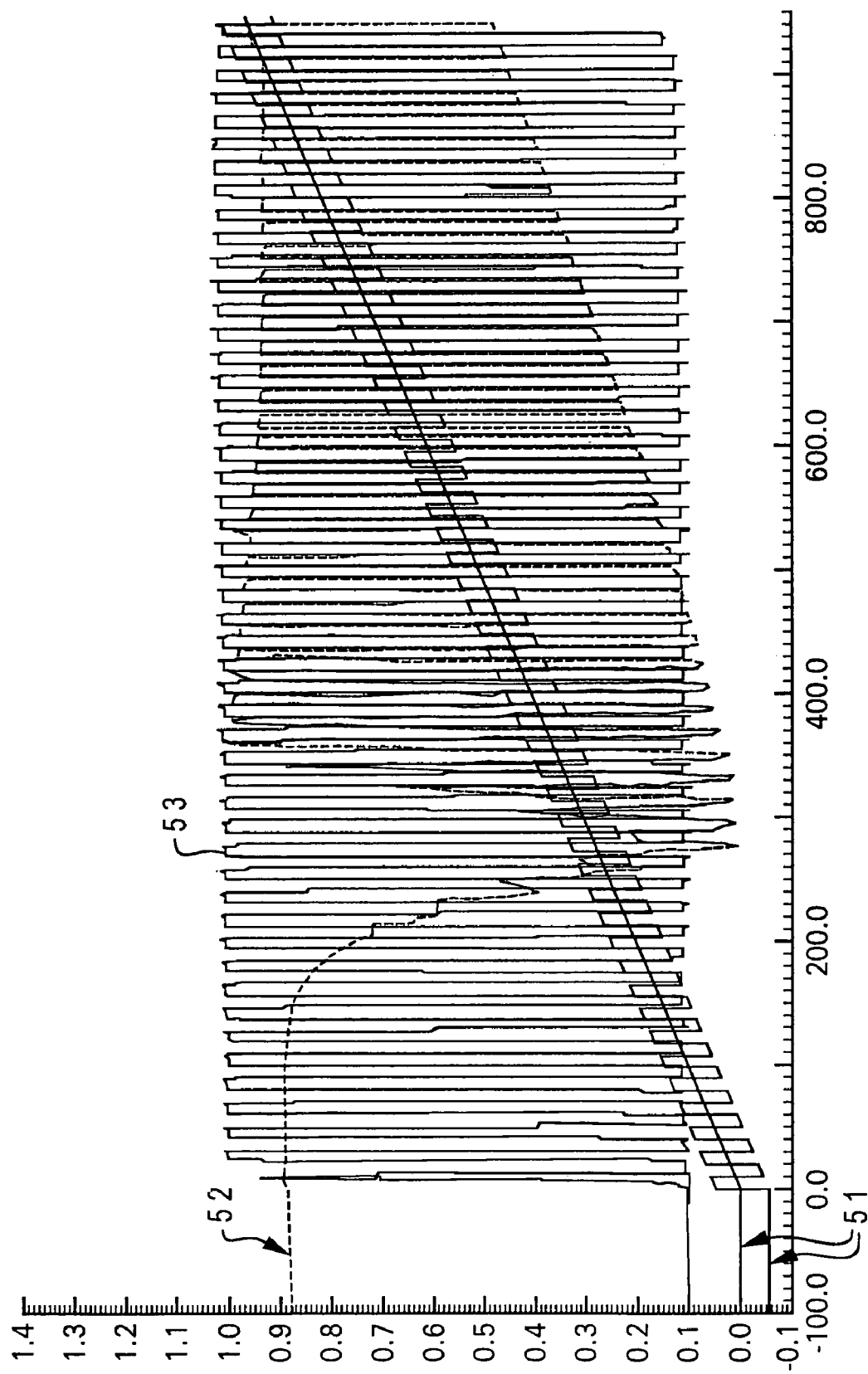
FIG. 3 graphically compares the common mode range of the differential amplifier circuit from FIG. 1 with the common mode range of a conventional differential amplifier circuit.

Referring now to FIG. 3, there is illustrated a graphical comparison between the common mode range of differential amplifier circuit 10 (from FIG. 1) and the common mode range of a conventional differential amplifier circuit. As shown, a pair of differential±50 mV input signals 51 is sent to both a conventional differential amplifier circuit and differential amplifier circuit 10, ramping from 0.0 V to approximately 0.8 V. The common mode range of the conventional differential amplifier circuit, as indicated by an output waveform 52, is not acceptable within the input voltage range of 0.1 V to 0.4 V. In contrast, the common mode range of differential amplifier circuit 10, as indicated by an output waveform 53, remains consistent throughout the input voltage range of approximately 50 mV through 0.8 V.

As has been described, the present invention proa low-voltage differential amplifier circuit having a relatively wide common mode range. The differential amplifier circuit of the present invention allows a switch point reference to be established by shorting two differential inputs to a single output, causing the entire differential amplifier to hang-up at the unity gain switch point. The output is then utilized as the reference voltage $V_{ref}$ input of the summing circuit to provide a nearly perfect centered reference point that tracks well over the entire voltage, process, temperature and common mode operating range.

While the invention has been particularly shown and described with reference to a preferred embodiment, it will be understood by those skilled in the art that various changes in form and detail may be made therein without departing from the spirit and scope of the invention.

The invention claimed is:

1. A differential amplifier circuit comprising:
   a first differential amplifier for receiving a pair of differential input signals to generate a first output;
   a second differential amplifier for receiving said pair of differential input signals to generate a second output;
   a summing circuit for summing said first output of said first differential amplifier and said second output of said second differential amplifier to provide a common output for said differential amplifier circuit; and
   a reference voltage generation circuit for providing a reference voltage signal to said summing circuit, wherein said reference voltage generation circuit is a differential amplifier.

2. The differential amplifier circuit of claim 1, wherein said first differential amplifier is an n-channel differential amplifier.

3. The differential amplifier circuit of claim 2, wherein said first differential amplifier includes a pair of n-channel transistors for receiving said pair of differential input signals, respectively.

4. The differential amplifier circuit of claim 1, wherein said second differential amplifier is a p-channel differential amplifier.

5. The differential amplifier circuit of claim 1, wherein said second differential amplifier includes a pair of p-channel transistors for receiving said pair of differential input signals, respectively.

6. The differential amplifier circuit of claim 1, wherein said summing circuit is an n-channel differential amplifier.

7. The differential amplifier circuit of claim 1, wherein said summing circuit includes an n-channel transistor pair, wherein a first transistor of said n-channel transistor pair receives said voltage reference signal from said reference voltage generation circuit, wherein a second transistor of said n-channel transistor pair receives combined output signals from said first output of said first differential amplifier and said second output of said second differential amplifier.

8. The differential amplifier circuit of claim 1, wherein said reference voltage generation circuit is a p-channel differential amplifier.

9. The differential amplifier circuit of claim 8, wherein said reference voltage generation circuit receives an active low ENABLE_P signal.

10. The differential amplifier circuit of claim 1, wherein said first and second differential amplifiers receive an active low ENABLE_N signal.

11. The differential amplifier circuit of claim 10, wherein said summing circuit receives an active low ENABLE_P signal.

12. The differential amplifier circuit of claim 11, wherein said summing circuit includes a clamp device to hold said common output high when said ENABLE_P signal is low.

13. The differential amplifier circuit of claim 1, wherein said first differential amplifier receives a gate control voltage $V_{CMN}$ to control the current through an n-channel transistor within said first differential amplifier in a consistent and predictable manner using a current mirror technique.

14. The differential amplifier circuit of claim 1, wherein said second differential amplifier receives a gate control voltage $V_{CMP}$ to control the current through a p-channel transistor within said second differential amplifier in a consistent and predictable manner using a current mirror technique.

15. The differential amplifier circuit of claim 1, wherein said summing circuit receives a gate control voltage $V_{CMN}$ to control the current through an n-channel transistor within said summing circuit in a consistent and predictable manner using a current mirror technique.

* * * * *